US010060970B2

(12) United States Patent
Kinoshita et al.

(10) Patent No.: US 10,060,970 B2
(45) Date of Patent: Aug. 28, 2018

(54) ELECTRONIC COMPONENT TESTING DEVICE

(71) Applicant: MURATA MANUFACTURING CO., LTD., Kyoto-fu (JP)

(72) Inventors: Naoki Kinoshita, Kyoto-fu (JP); Keiichiro Tanaka, Kyoto-fu (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 525 days.

(21) Appl. No.: 14/920,332

(22) Filed: Oct. 22, 2015

(65) Prior Publication Data

US 2016/0041223 A1      Feb. 11, 2016

Related U.S. Application Data

(63) Continuation of application No. PCT/JP2014/059525, filed on Mar. 31, 2014.

(30) Foreign Application Priority Data

Apr. 25, 2013   (JP) .................................. 2013-092137

(51) Int. Cl.
  *G01R 31/10*   (2006.01)
  *G01R 31/28*   (2006.01)
  *G01R 31/00*   (2006.01)
  *G01R 31/02*   (2006.01)

(52) U.S. Cl.
  CPC ....... *G01R 31/2875* (2013.01); *G01R 31/003* (2013.01); *G01R 31/2877* (2013.01); *G01R 31/028* (2013.01)

(58) Field of Classification Search
  CPC ................ Y02E 10/44; G01R 31/2849; G01R 31/2817; G01R 31/30; G01R 33/04; G01R 31/003; G01R 31/028; G01R 31/2875; G01R 31/2877; G01K 7/021;
  (Continued)

(56) References Cited

U.S. PATENT DOCUMENTS 5,798,649 A *  8/1998  Smayling ............. G01R 31/028
                                                    324/551
6,741,083 B2 * 5/2004  Baron .................. G01N 27/221
                                                    324/453
(Continued)

FOREIGN PATENT DOCUMENTS

| JP | H05-175298 A | 7/1993 |
| JP | H10-090345 A | 4/1998 |
| JP | 2000-138268 A | 5/2000 |

(Continued)

OTHER PUBLICATIONS

International Search Report and Written Opinion from PCT/JP2014/059525 dated Jul. 1, 2014.
(Continued)

*Primary Examiner* — Vinh Nguyen
(74) *Attorney, Agent, or Firm* — Studebaker & Brackett PC

(57) ABSTRACT

An electronic component testing device which is able to release heat (radiate heat) efficiently from a self-heating electronic component, and is able to carry out an intended test efficiently while keeping the temperature of the electronic component within a predetermined range higher than ordinary temperature.

5 Claims, 4 Drawing Sheets

(58) Field of Classification Search
CPC ........ G01K 15/005; G01K 15/00; G01K 5/58; G01K 17/12; G01L 21/01
See application file for complete search history.

(56) References Cited

U.S. PATENT DOCUMENTS 6,956,391 B2 * 10/2005 Kamitani ............. G01R 31/016
 324/750.05
2006/0097740 A1 5/2006 Howland, Jr. et al.

FOREIGN PATENT DOCUMENTS

| | | |
|---|---|---|
| JP | 2001-264381 A | 9/2001 |
| JP | 2001-343419 A | 12/2001 |
| JP | 2004-177169 A | 6/2004 |
| JP | 2007-129090 A | 5/2007 |
| JP | 2008-519435 A | 6/2008 |
| JP | 2008-192994 A | 8/2008 |
| JP | 2008-275512 A | 11/2008 |
| JP | 2009-250810 A | 10/2009 |
| JP | 2010-034575 A | 2/2010 |
| JP | 2013-053898 A | 3/2013 |

OTHER PUBLICATIONS

An Office Action; "Notice of Preliminary Rejection," issued by the Korean Patent Office dated Sep. 2, 2016, which corresponds to Korean Patent Application No. 10-2015-7029239 and related to U.S. Appl. No. 14/920,332; with English language translation.

* cited by examiner

ELECTRONIC COMPONENT TESTING DEVICE

CROSS REFERENCE TO RELATED APPLICATIONS

This application claims benefit of priority to International Patent Application No. PCT/JP2014/059525 filed Mar. 31, 2014 and JP 2013-092137 filed Apr. 25, 2013, the entire content of each of which is incorporated herein by reference.

TECHNICAL FIELD

The present disclosure relates to an electronic component testing device, and more particularly, an electronic component testing device which is used for carrying out a test by applying a voltage to a self-heating electronic component under a predetermined temperature condition.

BACKGROUND ART

In the case of carrying out a test by applying a predetermined stress such as a voltage to a self-heating electronic component at a predetermined test temperature, a cooling mechanism is conventionally used to keep the temperature of the electronic component within a certain range which otherwise exceeds the test temperature.

Further, as such a temperature control system, for example, Japanese Patent Application Laid-Open No. 2009-250810 proposes a temperature control system including: a cooling system including a flow channel through which a coolant flows, and a heat absorber and a heat radiator provided in the course of the flow channel, for cooling an electronic component by heat exchange through the heat absorber that is brought in direct or indirect contact with the electronic component to absorb the heat and through the heat radiator that radiates the heat absorbed by the heat absorber to the coolant; a heating system for heating the electronic component; and a controller for controlling the temperature of the electronic component by controlling the operation of the heating system, where the radiator of the cooling system is provided with a heat radiation member composed of a foam metal member.

Further, the thus configured temperature control system in Japanese Patent Application Laid-Open No. 2009-250810 is supposed to be able to control the temperature of an electronic component with excellent responsiveness even when the electronic component produces a large amount of heat due to self-heating, and makes it possible to conduct a characteristic inspection for the electronic component while keeping the temperature of the electronic component at a predetermined temperature with accuracy.

However, in this case of Japanese Patent Application Laid-Open No. 2009-250810, since a member (a heat conduction block (see FIG. 1 of Japanese Patent Application Laid-Open No. 2009-250810)) provided in a temperature sensor (a first temperature sensor 11 (see FIG. 1 of Japanese Patent Application Laid-Open No. 2009-250810)) has a large heat capacity, the temperature of the electronic component is estimated to be lower than it is because of diffusion of heat transferred from the electronic component, and thus, the system of Japanese Patent Application Laid-Open No. 2009-250810 is unable to accurately detect the temperature of the self-heating electronic component.

In particular, in the case of carrying out a test in which a voltage is applied to an electronic component with negative resistance-temperature characteristics, a phenomenon referred to as thermal runaway may be caused in which self-heating by electrical conduction increases the temperature, the temperature rise decreases the resistance to increase the electric current, and the current further increases self-heating. Therefore, feedback control cannot catch up with the self-heating of such an electronic component, thereby causing thermal runaway.

Furthermore, Japanese Patent Application Laid-Open No. 2008-275512 proposes an aging system in which a cooling plate subjected to heat exchange by a coolant supplied from a coolant supply unit is brought into contact with a self-heating sample body to cool the sample body for temperature regulation, the aging system including: a temperature detection unit for detecting the temperature of the sample body; and a coolant flow rate regulation unit for regulating the flow rate of the coolant supplied by the coolant supply unit on the basis of the result of detecting the temperature of the sample body by the temperature detection unit.

Further, this aging system is supposed to follow the change in the temperature of the self-heating sample body, thereby allowing the change in the temperature of the sample body to be reduced.

However, the aging system also has the problem of insufficiency due to the fact that a temperature sensor is attached directly to the sample body, and when there is a need to frequently replace a lot of electronic components and measure the temperatures, the operation of attaching the temperature sensor is produced every time the measurement target electronic component is replaced. Moreover, in the case of attaching the temperature sensor to the water-cooling plate, since the temperature of the sample body is not directly measured, the temperature of the electronic component is estimated to be lower than it is, and the same problem as with Japanese Patent Application Laid-Open No. 2009-250810 is caused, that is, the temperature of the self-heating electronic component cannot be accurately detected.

SUMMARY OF THE DISCLOSURE

Problem to be Solved by the Disclosure

The present disclosure is intended to solve the problems mentioned above, and an object of the present disclosure is to provide an electronic component testing device which is used for carrying out a test by applying a voltage to a self-heating electronic component under a predetermined temperature condition, which is able to allow a self-heating electronic component to release heat (radiate heat) efficiently, and able to carry out an intended test efficiently while keeping the temperature of the electronic component which is likely to cause thermal runaway due to the self-heating within a predetermined range.

Means for Solving the Problem

In order to solve the problems mentioned above, the electronic component testing device according to the present disclosure is:

an electronic component testing device for carrying out a test by applying a voltage while keeping a self-heating electronic component that includes a first external electrode and a second external electrode at a predetermined test temperature higher than ordinary temperature, the device including:

a first conduction terminal that is brought into abutment with the first external electrode included in the electronic component;

a temperature sensor of the first conduction terminal, for measuring the temperature of the electronic component;

a second conduction terminal that is brought into abutment with the second external electrode included in the electronic component, the second conduction terminal including a heater for heating the electronic component to the test temperature, and having the ability to release a larger amount of heat than the amount of heat generated by self-heating of the electronic component; and a control unit for feeding back the temperature of the electronic component detected by the temperature sensor to the heater, and controlling the heater so that the temperature of the electronic component is kept at the predetermined test temperature.

Preferably, the electronic component testing device further includes an auxiliary heater provided near the first conduction terminal to keep heat from escaping from the electronic component through the first conduction terminal.

Providing the auxiliary heater near the first conduction terminal makes it possible to keep heat from escaping from the electronic component through the first conduction terminal, and the heat radiation ability and heating ability of the second conduction terminal make it possible to keep the electronic component at a predetermined temperature more reliably.

Preferably, the first conduction terminal includes a plurality of first conduction terminals, the individual first conduction terminals are brought into abutment with respective first external electrodes of a plurality of self-heating electronic components arranged in order, the temperature sensor is provided to at least one of the first conduction terminals in individual abutment with the plurality of electronic components, and the second conduction terminal is brought into abutment with second external electrodes of the plurality of electronic components.

The use of one second conduction terminal for a plurality of electronic components makes it possible to lower the thermal resistance of the second conduction terminal effectively, and achieve reduction in device size, as compared with a case of using a plurality of second conduction terminals.

Preferably, the individual first conduction terminals are brought into abutment with the respective first external electrodes of the plurality of electronic components and the second conduction terminal is brought into abutment with the second external electrode to heat the plurality of electronic components to a predetermined test temperature, the temperature sensor includes a plurality of temperature sensors that detect respective temperatures of the plurality of electronic components, or the temperatures of predetermined electronic component groups into which the plurality of electronic components are divided, and the device is configured to perform a calculation for averaging or extracting a representative value from the temperatures detected by the plurality of temperature sensors, feed the average value or the representative value back to the heater to control the heater so that the temperatures of the electronic components or electronic component groups are kept at the predetermined test temperature, and when the temperature detected by any of the temperature sensors is abnormal, exclude an electronic component or an electronic component group from which the abnormal temperature is detected from objects of calculation.

The above-mentioned configuration makes it possible to, for example, when an abnormal temperature is detected due to self-heating in each electronic component or each electronic component group, detect the abnormal temperature as an outlier, thereby making it possible to almost eliminate the influence on the other majority of electronic components, and allowing proper temperature control to be achieved.

Preferably, the electronic component testing device further includes a cooling unit that cools the second conduction terminal with airflow.

The above-mentioned configuration makes it possible to lower the thermal resistance of the second conduction terminal, and improve the feedback property for self-heating of the electronic component, thereby succeeding in making thermal runaway less likely to be caused.

Advantageous Effect of the Disclosure

The electronic component testing device according to the present disclosure uses a first conduction terminal that is brought into abutment with the first external electrode of the electronic component. The first conduction terminal includes a temperature sensor for measuring the temperature of the electronic component. A second conduction terminal is brought into abutment with a second external electrode of the electronic component. The second conduction terminal includes a heater for heating the electronic component to the test temperature. The heater has the ability to release a larger amount of heat than the amount of heat generated by self-heating of the electronic component. A control unit feeds back the temperature of the electronic component detected by the temperature sensor to the heater. The control unit controls the heater so that the temperature of the electronic component is kept at a predetermined temperature, thus enhancing the responsiveness of the temperature feedback, and making it possible for the temperature detected by the temperature sensor to give close agreement with temperature of the electronic component, by accurately controlling the temperature of the electronic component.

It is to be noted that when the second conduction terminal has the ability to release a larger amount of heat than the amount of heat generated by self-heating of the electronic component, equilibrium can be achieved between the amount of heat generation and the amount of heat release.

On the other hand, when the ability of the second conduction terminal to release the amount of heat is lower than the amount of heat generated by self-heating of the electronic component, no equilibrium can be achieved between the amount of heat generation and the amount of heat release, but the temperature will continue to increase.

As a result, in the case of carrying out the test by heating the self-heating electronic component to a predetermined test temperature, it becomes possible to carry out the test with accuracy by preventing self-heating and thus thermal runaway of the electronic component, and keeping the temperature of the electronic component at the predetermined test temperature.

Features of the present disclosure will be described in detail below with reference to embodiments of the present disclosure.

EMBODIMENT 1

Figure 1:
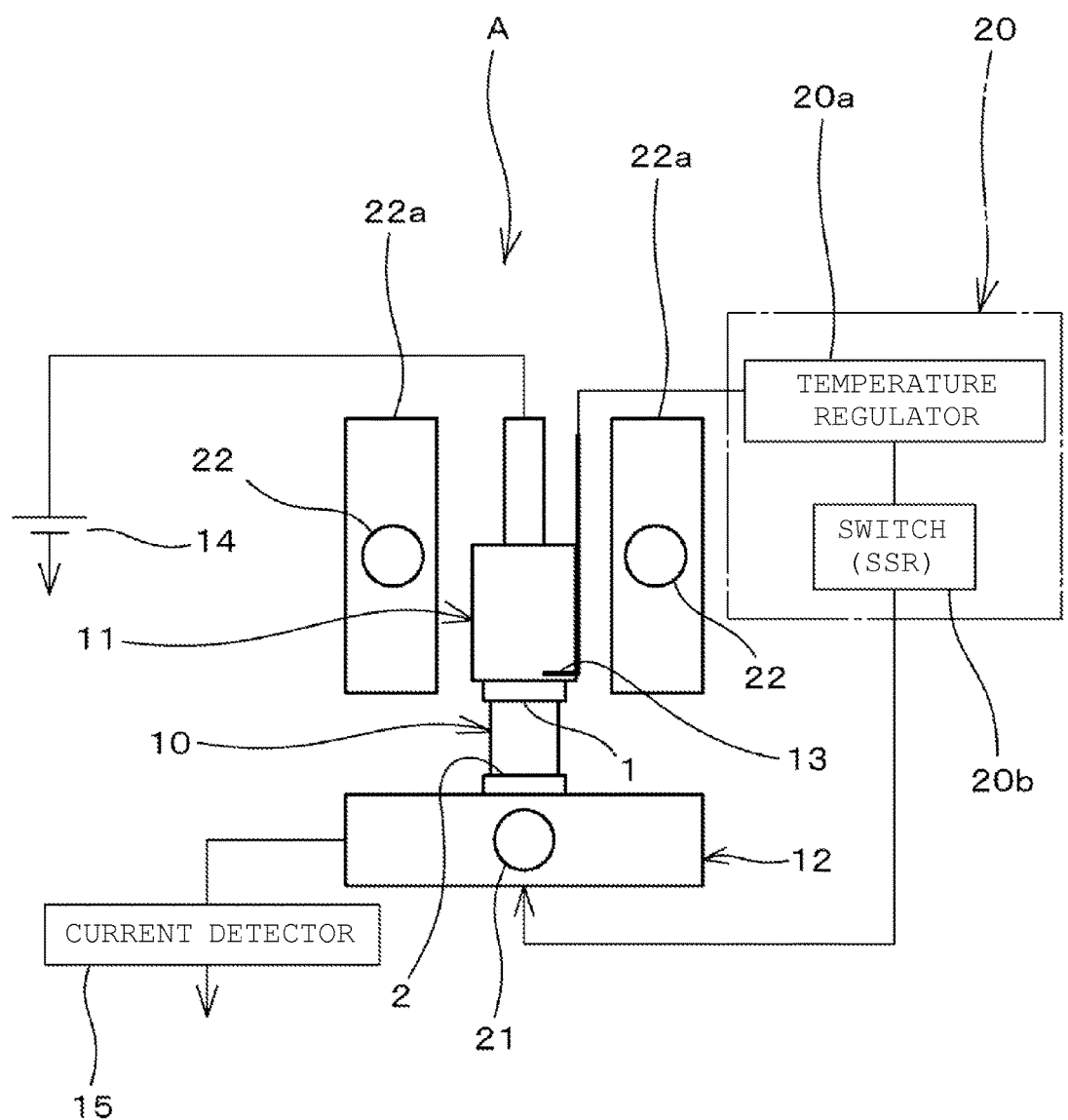
FIG. 1 is a diagram illustrating the configuration of an electronic component testing device according to an embodiment (Embodiment 1) of the present disclosure.

In Embodiment 1, an example of an electronic component testing device A for use in a screening step such as burn-in or a measuring step at high temperature will be described, where as shown in FIG. 1, a self-heating electronic component (a multilayer ceramic capacitor in Embodiment 1) 10 including a pair of external electrodes of a first external electrode 1 and a second external electrode 2 is heated to a predetermined temperature (measurement temperature) higher than ordinary temperature, and a voltage is applied after a lapse of a predetermined period of time.

This electronic component testing device A is, as described above, a device for carrying out a test by applying a voltage while keeping the self-heating electronic component (multilayer ceramic capacitor) 10 at a predetermined test temperature higher than ordinary temperature.

Further, the testing device A includes a metallic rod-like first conduction terminal 11 that is brought into abutment with the first external electrode 1 included in the electronic component (multilayer ceramic capacitor) 10, and a temperature sensor (a thermocouple in Embodiment 1) 13 for measuring the temperature of the electronic component 10 in a position of the first conduction terminal 11 where the first conduction terminal 11 is brought into abutment with the first external electrode 1 of the electronic component 10.

Furthermore, near the first conduction terminal 11, auxiliary heaters 22 are provided for keeping heat from escaping from the electronic component 10 through the first conduction terminal 11.

In addition, the testing device A includes a second conduction terminal 12 that is brought into abutment with the second external electrode 2 included in the electronic component 10, the second conduction terminal 12 including a heater (heater for electronic component heating) 21 for heating the electronic component to the test temperature, and having the ability to release a larger amount of heat than the amount of heat generated by self-heating of the electronic component 10. Further, a current detector 15 is connected to the second conduction terminal 12.

Moreover, the testing device A includes a control unit 20 for feeding back the temperature of the electronic component 10 detected by the temperature sensor 13, thereby controlling the heater 21 so as to keep the temperature of the electronic component 10 at a predetermined temperature. In Embodiment 1, the control unit 20 includes a temperature regulator 20a and a switch (such as a SSR) 20b.

For carrying out a test on the electronic component (multilayer ceramic capacitor) 10 with the use of the testing device A, the test is carried out in accordance with the following procedure, for example.

(1) The electronic component 10 is set in position, the first conduction terminal 11 is brought into abutment with the first external electrode 1, and the second conduction terminal 12 is brought into abutment with the second external electrode 2.

(2) The electronic component 10 is heated to the test temperature (target temperature) (for example, 100° C.) by applying current to the heater (heater for electronic component heating) 21. It is to be noted that the temperatures of the heater (heater for electronic component heating) 21 and auxiliary heaters 22 are measured in Embodiment 1.

The test temperature is typically supposed to be 100° C. or higher and 400° C. or lower.

However, for example, when the external electrode of the electronic component such as a multilayer ceramic capacitor includes a Sn layer, the upper limit is set to 232° C. or less so as not to exceed the melting point of Sn. In addition, for example, when wiring for connecting the first and second conduction terminals and a voltage supply (power supply) 14 or wiring for grounding is made of a common fluorine resin electrical wire, the upper limit is set to 260° C. or less.

(3) Then, a predetermined voltage is applied to the electronic component 10. For example, the electric field intensity is adjusted to 20 kV/mm or more, and the voltage is adjusted to on the order of 3 V to 1000 V.

(4) During the application of the voltage, for control, the temperature of the electronic component 10 is detected, and fed back to the heater (heater for electronic component heating) 21 of the second conduction terminal.

In the case of the configuration in FIG. 1, the temperature of the electronic component 10 is kept at a predetermined test temperature by switching control of the switch 20b connected to the heater 21 of the second conduction terminal 12.

(5) After a lapse of a predetermined period of time, the application of the voltage is ended, and the electronic component (multilayer ceramic capacitor) 10 is ejected which has been subjected to the test.

Type of Electronic Component to be Subjected to Test

Further, examples of the electronic component which is able to be subjected to the test with the use of the electronic component testing device A according to Embodiment 1 include, besides the multilayer ceramic capacitor as described above, semiconductor devices such as negative temperature coefficient thermistors, diodes, and transistors, and capacitors other than ceramic capacitors.

In addition, the electronic component to be subjected to the test with the use of the testing device according to the present disclosure is basically supposed to have a structure including the first external electrode and the second external electrode, but may be an electronic component further including other external electrodes.

First Conduction Terminal

Furthermore, the first conduction terminal 11 constituting the electronic component testing device A according to Embodiment 1 is provided with the temperature sensor 13, and configured to have both a function as a terminal for applying a voltage and a function of measuring the temperature of the electronic component.

It is to be noted that the temperature detected by the temperature sensor 13 is fed back to the heater 21 provided in the second conduction terminal 12.

The first conduction terminal 11 is typically composed of a metal, and configured to abut the first external electrode 1 of the electronic component (multilayer ceramic capacitor in Embodiment 1) 10 when the electronic component 10 is disposed in position.

It is to be noted that metal materials for use in the first conduction terminal 11 include, for example, metals such as Cu, Fe, and Al.

In addition, while the first conduction terminal 11 is supposed to have a rod-like structure in Embodiment 1, the structure is not limited to the shape of a rod, but it is possible to have the shape of a plate spring, or the shape of other common measuring terminal.

In addition, in order to maintain favorable electrical contact, a structure that has a spring property such that the structure is biased toward the external electrode of the electronic component is typically desired, such as a spring probe or a plate spring.

In addition, for favorable electrical contact, it is also possible to plate the surface of contact with the external electrode (first external electrode 1) of the electronic component 10, with Au, Ag, Ni, Sn, or the like.

In addition, the first conduction terminal 11 desirably, from the perspective of keeping heat of the electronic component 10 from escaping through the first conduction terminal 10, has a high thermal resistance to the outside air, and desirably has a surface area reduced by making the terminal thin as much as possible, for example. The terminal may be covered with a heat insulator.

In addition, the thermal resistance of the first conduction terminal 11 is desirably higher than the thermal resistance of the second conduction terminal 12. For example, when the second conduction terminal 12 has a thermal resistance of 40° C./W, the first conduction terminal 11 desirably has a thermal resistance approximately 10 to 100 times as high as the thermal resistance of the second conduction terminal 12.

Further, in Embodiment 1, in order to more reliably prevent heat of the electronic component 11 from escaping through the first conduction terminal 11 to the outside, the auxiliary heaters 22 are provided near the first conduction terminal 11.

Temperature Sensor

In Embodiment 1, a thermocouple-type temperature sensor is used as the temperature sensor 13. This temperature sensor 13 is desirably disposed near the electronic component 10 as much as possible, from the perspective of accurately detecting the temperature of the electronic component 10.

In addition, in order to enhance heat transfer from the electronic component to a sensing part (tip) of the temperature sensor 13, it is preferable to use, for the line leading to the tip, a material that is as high as possible in thermal conductivity.

Specifically, it is desirable to use Cu, Ag, Al, carbon, etc. which are typically classified in high thermal conductivity materials. It is to be noted that these materials all exceed 50 W/m·K in thermal conductivity.

Auxiliary Heater

As described above, the auxiliary heaters 22 are used in order to prevent heat of the electronic component 10 from escaping through the first conduction terminal 11 to the outside in Embodiment 1, and the use of the auxiliary heaters makes it easy to keep the electronic component 10 at intended temperature more reliably, even when the thermal resistance of the first conduction terminal 11 to outside air is not very high.

It is to be noted that the auxiliary heater 22 is configured to be embedded in an auxiliary heater body 22*a* provided near the first conduction terminal 11.

While embedded cartridge heaters are used as the auxiliary heaters 22, the auxiliary heater is not limited thereto, but it is also possible to use other types of heaters.

Second Conduction Terminal

The second conduction terminal 12 is typically composed of a metal, and configured to abut the second external electrode 2 of the electronic component 10 when the electronic component (multilayer ceramic capacitor in Embodiment 1) 10 is disposed in position.

In addition, it is preferable to use, as a constituent material of the second conduction terminal 12, a metal material such as Cu, Fe, or Al, for example. While the second conduction terminal 12 formed from a metal plate is used in Embodiment 1, the second conduction terminal is not limited to a terminal composed of a metal plate, but it is possible to adopt the shape of a plate spring, or the shape of other common measuring terminal.

In addition, in order to maintain favorable electrical contact, typically the second conduction terminal 12 is desirably structured to have a spring property such that the terminal is biased toward the external electrode (second external electrode 2) of the electronic component 10, such as a spring probe or a plate spring.

It is to be noted that when the first conduction terminal 11 is structured to have a spring property such that the terminal is biased toward the external electrode of the electronic component, there is no need for the second conduction terminal 12 to be structured to have a spring property such that the terminal is biased toward the external electrode of the electronic component.

In addition, in Embodiment 1, the second conduction terminal 12 is configured to function not only as a conduction terminal, but also as a heating-cooling terminal.

To that end, it is desirable to form the terminal with the use of a high thermal conductivity material, and increase the surface area (reduce the thermal resistance).

It is to be noted that the material and the surface area will be determined typically on the basis of the thermal resistance desired to be set.

In addition, for favorable electrical and thermal connection between the second conduction terminal 12 and the second external electrode 2 of the electronic component 10, it is also possible to plate the surface of contact with the second external electrode 2 of the electronic component 10, with Au, Ag, Ni, Sn, or the like.

It is to be noted that, for example, in a case where the self-heating of the electronic component is 0.5 W, there is a need to make the thermal resistance 40° C./W or less when the temperature rise of the electronic component is intended to be 20° C. or less.

Due to the fact that the thermal resistance is inversely proportional to the thermal conductivity and the surface area, in a specific device in accordance with Embodiment 1, the surface of the second conduction terminal 12 has been subjected to electroless nickel plating with a thermal conductivity of 90.9 W/m·K to provide a surface area of 30,000 mm$^2$, thereby succeeding in achieving the above thermal conductivity of 40° C./W or less.

Further, it is also possible to change the shape of the second conduction terminal 12 for the purpose of lowering the thermal resistance. For example, the second conduction terminal 12 may be configured to be U-shaped like a radiation fin, thereby increasing the surface area to reduce the thermal resistance.

Heater (Heater for Electronic Component Heating)

Furthermore, the second conduction terminal 12 constituting the electronic component testing device A according to Embodiment 1 includes the heater (heater for electronic component heating) 21 for heating the electronic component 10. Thus, the second conduction terminal 12 functions as a terminal for applying a voltage, and also functions as a terminal for heating and cooling the electronic component 10.

In Embodiment 1 herein, the second conduction terminal 12 with the embedded heater 21 embedded therein is configured so that ON/OFF control can achieve temperature control. While a cartridge heater is used as the heater 21 in Embodiment 1, it is also possible to use other types of heaters.

Driving Source for First Conduction Terminal and Second Conduction Terminal

The electronic component testing device A according to Embodiment 1 herein needs to include a driving source (not shown) that allows the first conduction terminal 11 and the second conduction terminal 12 to sandwich and hold the electronic component 10, also function as conduction terminals in contact with the first and second external electrodes 1, 2, and after the test, release the electronic component. Further, in such an aspect, a common driving mechanism such as a servomotor, a pulse motor, a solenoid, an air cylinder, or a cam, for example, can be used as a driving source (not shown) for operating at least one of the first conduction terminal 11 and the second conduction terminal 12.

Application of Voltage • Measurement System

The electronic component testing device A according to Embodiment 1 herein includes a mechanism for applying a constant voltage between the first conduction terminal 11 and the second conduction terminal 12. More specifically, the voltage supply 14 is connected to the first conduction terminal 11, a voltage is applied to the first external electrode 1 of the electronic component 10, and an electric current is detected by the current detector 15 provided to the second conduction terminal 12 connected to the second external electrode 2 of the electronic component 10. It is to be noted that the current detector 15 is virtually or actually grounded.

While the device is adapted so that an electric current is detected by the current detector 15 provided to the second conduction terminal 12 in Embodiment 1 herein, it is also possible to be configured to connect the voltage supply (power supply) 14 to the second conduction terminal 12, apply a voltage to the second external electrode 2 of the electronic component 10, and detect an electric current with a current detector provided to the first conduction terminal 11 connected to the first external electrode 1 of the electronic component 10.

It is to be noted that the current detector may be present or absent depending on the type of the test. In addition, while a current-limiting circuit (for example, a series resistance) may be present or absent in the voltage supply, it is common to insert some series resistance or fuse element in order to prevent the voltage supply from breaking down.

Control Unit (Temperature Feedback Control System)

As the control unit 20, a temperature regulator is used for control such as a commonly used PID control.

However, it is also possible to be configured to control the switch by calculating with a controller for external control through the use of any other control method.

The electronic component testing device A according to Embodiment 1 makes heat less likely to escape through the first conduction terminal 11 provided with the temperature sensor 13 to the outside, thus making it possible for the temperature detected by the temperature sensor 13 to give close agreement with the actual temperature of the electronic component 10. Furthermore, the second conduction terminal 12 can efficiently heat and cool the electronic component 10, thus making it possible to make the responsiveness of temperature feedback fast, and the temperature of the electronic component 10 can be accurately controlled. As a result, in the case of carrying out the test by heating the self-heating electronic component 10 to a predetermined test temperature, it becomes possible to accurately carry out the test at the predetermined test temperature by preventing self-heating and thus thermal runaway of the electronic component 10.

In addition, the temperature sensor 13 is incorporated in the first conduction terminal 11, thus making it possible to save the space, and achieve a reduction in device size, and making it possible to reduce the equipment cost in a simple configuration.

In addition, just operating at least one of the first conduction terminal 11 and second conduction terminal 12 can ensure that the first conduction terminal 11 and the second conduction terminal 12 are brought into abutment with the electronic component 10 to have the temperature sensor 13 provided near the external electrode of the electronic component 10, and therefore the work efficiency can be improved in the case of handling a large number of electronic components 10 in a short cycle, as compared with a case where a temperature sensor such as a thermocouple is attached to an external electrode of an electronic component.

As described above, the electronic component testing device according to Embodiment 1 makes it possible to improve the general responsiveness of temperature feedback. Thus, the electronic component testing device is particularly useful for testing an electronic component that has negative resistance-temperature characteristics and is likely to cause thermal runaway due to self-heating, because the test can be accurately carried out by preventing thermal runaway during the test.

EMBODIMENT 2

Figure 2:
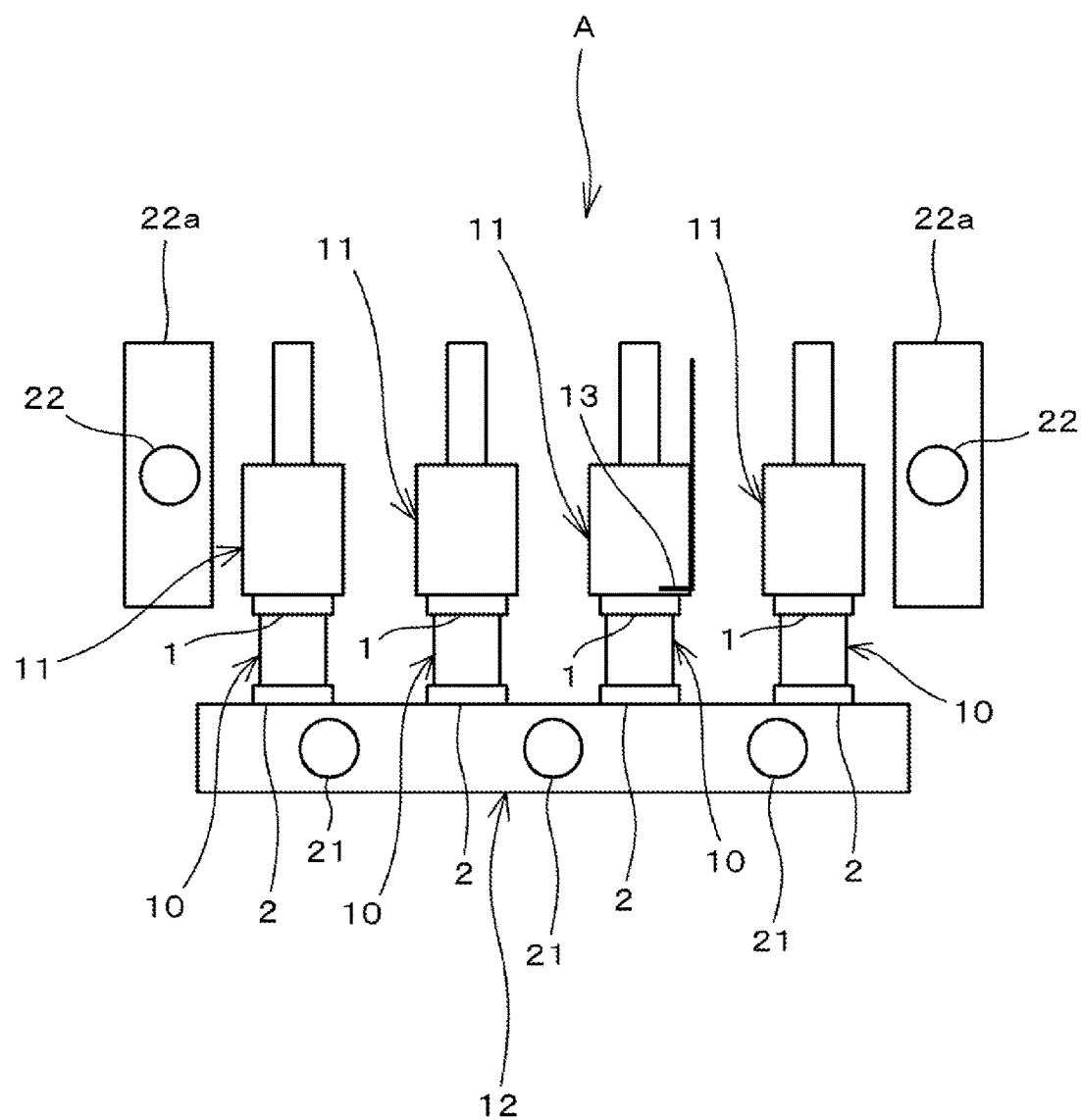
FIG. 2 is a diagram illustrating the configuration of a main part of an electronic component testing device according to another embodiment (Embodiment 2) of the present disclosure.

FIG. 2 is a diagram illustrating the configuration of a main part of an electronic component testing device according to another embodiment (Embodiment 2) of the present disclosure.

The electronic component testing device A according to Embodiment 2 is configured so that, as shown in FIG. 2, first conduction terminals 11 individually abut respective first external electrodes 1 of a plurality of electronic components (multilayer ceramic capacitors) 10 arranged in order, (disposed in parallel, side by side, or any other arrangement suitable for measuring temperature) and a temperature sensor 13 is provided to one of the plurality of first conduction terminals 11 in individual abutment with the plurality of electronic components 10, and one second conduction terminal 12 abuts second external electrodes 2 of the plurality of electronic components 10.

In addition, near the right and left first conduction terminals 11 on both sides of the plurality of first conduction terminals 11, auxiliary heaters 22 are provided for suppressing heat release from the electronic component 10.

It is to be noted that while the temperature sensor 13 is provided for only one of the plurality of first conduction terminals 11 as shown in FIG. 2 in Embodiment 2, the temperature sensor 13 may be provided for a plurality of predetermined first conduction terminals 11, or the temperature sensor 13 may be provided for each of all the first conduction terminals 11.

It is to be noted that in the case of providing the temperature sensor 13 to the plurality of predetermined first conduction terminals 11, the temperature control requires calculating an average value or a representative value for the sensors, and controlling ON/OFF of the heater 21 on the basis of the calculation result. The others can be configured as in the case of Embodiment 1 described above.

It is to be noted that cases of calculating the representative value include a case of listing measurement values of the plurality of sensors in order and selecting the sensor near the center, and a case of determining priorities of the sensors and excluding an after-mentioned outlier sensor.

It is to be noted that the parts denoted by the same reference symbols as in FIG. 1 represent the same or corresponding parts in FIG. 2 illustrating the testing device A according to Embodiment 2 of the present disclosure.

When the thermal resistance of the second conduction terminal 12 is intended to be lowered, the second conduction terminal 12 is required to be enlarged. In this regard, it becomes possible to achieve a great heat radiation effect when one large second conduction terminal 12 is brought into contact with the plurality of electronic components 10. More specifically, the second conduction terminal 11 adopted as a unit without being separated into individual parts makes it possible to increase the volume of the second conduction terminal 12 which is configurable per unit volume, and can achieve a great radiation effect.

Further, as a result, it becomes possible to effectively lower the thermal resistance of the second conduction terminal 12, and the reduction in device size can be achieved.

In addition, the lowered thermal resistance of the second conduction terminal 12 suppresses the temperature increase of the electronic component 10 due to self-heating, and improves the responsiveness of temperature feedback. Furthermore, the device configuration is simplified, thus making it possible to reduce the equipment cost.

EMBODIMENT 3

Figure 3:
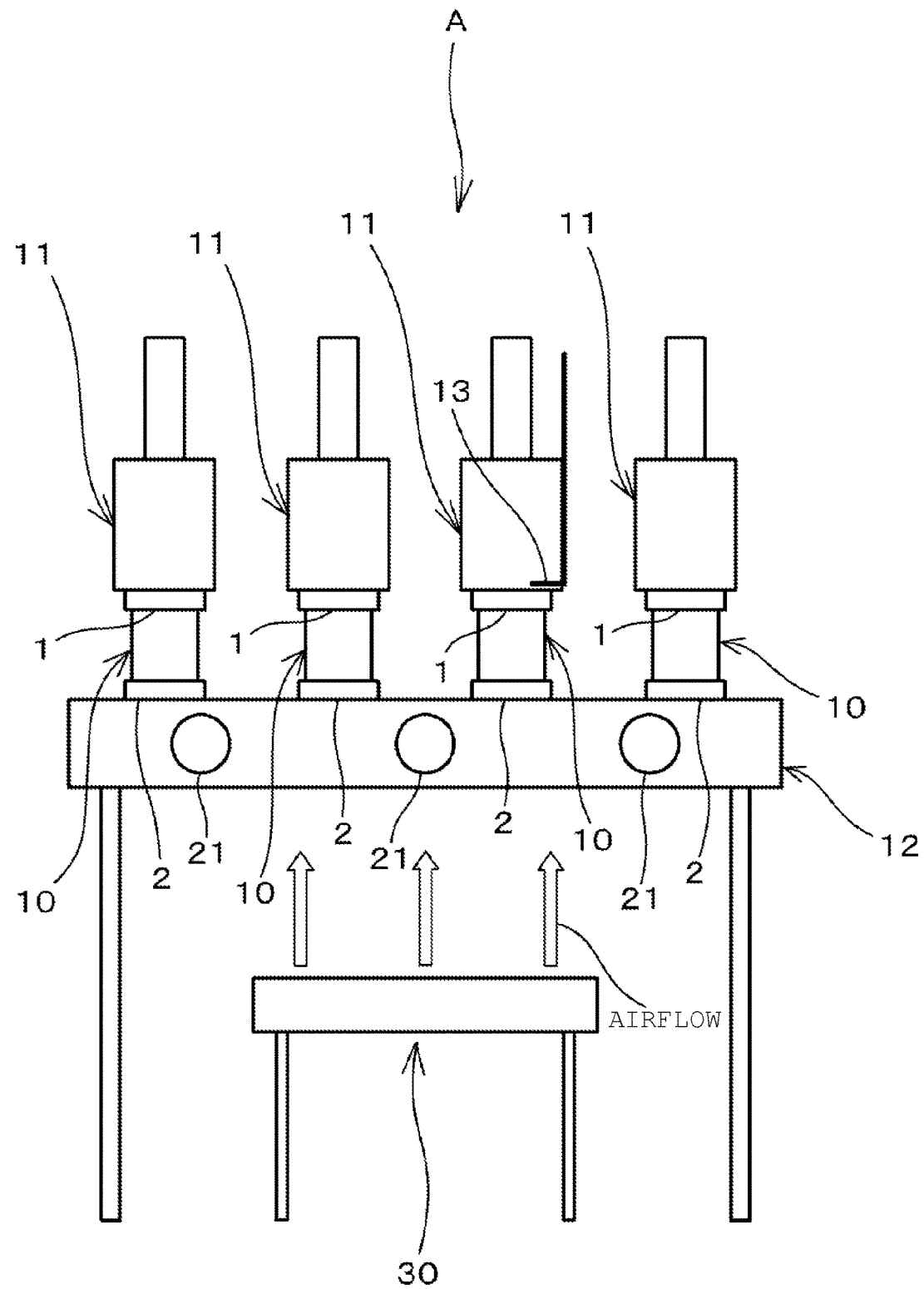
FIG. 3 is a diagram illustrating the configuration of a main part of an electronic component testing device according to yet another embodiment (Embodiment 3) of the present disclosure.

FIG. 3 is a diagram illustrating the configuration of a main part of an electronic component testing device A according to yet another embodiment (Embodiment 3) of the present disclosure.

The electronic component testing device A according to Embodiment 3 is configured so that, as shown in FIG. 3, individual first conduction terminals 11 are brought into abutment with respective first external electrodes 1 of a plurality of electronic components (multilayer ceramic capacitors) 10 disposed in parallel, and a temperature sensor 13 is provided to one of the first conduction terminals 11 in individual abutment with the plurality of electronic components 10, and one second conduction terminal 12 is brought into abutment with second external electrodes 2 of the plurality of electronic components 10.

It is to be noted that the electronic component testing device A according to Embodiment 3 is configured without including the auxiliary heaters provided in the electronic component testing devices A according to Embodiments 1 and 2.

It is to be noted that while the temperature sensor 13 may be provided to only one of the plurality of first conduction terminals 11 as shown in FIG. 3, the temperature sensor 13 may be provided to a plurality of first conduction terminals 11, or the temperature sensor 13 may be provided to each of all the first conduction terminals 11.

In the case of providing the temperature sensor 13 to the plurality of predetermined first conduction terminals 11, the temperature control requires calculating an average value or a representative value for the sensors, and controlling ON/OFF of the heater on the basis of the calculation result.

Further, in the electronic component testing device A according to Embodiment 3, a fan 30 is provided as a blast unit below the second conduction terminal 12 to blow air to the second conduction terminal 12, thereby improving the cooling ability of the second conduction terminal 12. It is to be noted that the fan (blast unit) 30 mentioned above may be adapted to switch ON/OFF if necessary, or to blow air continuously to the second conduction terminal 12 with the fan kept ON.

As in the electronic component testing device A according to Embodiment 3, when air is blown through the fan 30 to the second conduction terminal 12 to improve the cooling ability, the thermal resistance of the second conduction terminal 12 can be lowered to suppress the temperature increase of the electronic components 10 due to self-heating.

Furthermore, the thermal resistance of the second conduction terminal 12 is lowered, thus making it possible to cool the electronic components 10 quickly when the electronic components 10 cause self-heating. Thus, the responsiveness of feedback is improved, thereby making thermal runaway less likely to be caused.

It is to be noted that while air is blown directly to the second conduction terminal 12 through the fan 30 as a blast unit to improve the cooling ability of the second conduction terminal 12 in Embodiment 3, it is also possible to be configured to lower the thermal resistance with airflow (flow of air) with the use of a fan that circulates air near the second conduction terminal 12, rather than blowing air directly to the second conduction terminal 12.

In addition, while the fan is used as a blast unit in Embodiment 3, the blast unit is not to be considered limited to the fan, but it is also possible to use such a blast unit that blows out gas through a nozzle.

Although the electronic component testing device A according to Embodiment 3 includes no auxiliary heater as described above, as long as the second conduction terminal 12 has adequate heating and cooling functions, the temperatures of the electronic components 10 can be kept at a predetermined test temperature while suppressing the temperature increase of the electronic components 10 due to self-heating even when there is a somewhat temperature deviation between the sensors and the work.

It is to be noted that also in the case of the electronic component testing device A configured according to Embodiment 3, it is possible to adopt a configuration including an auxiliary heater.

EMBODIMENT 4

Figure 4:
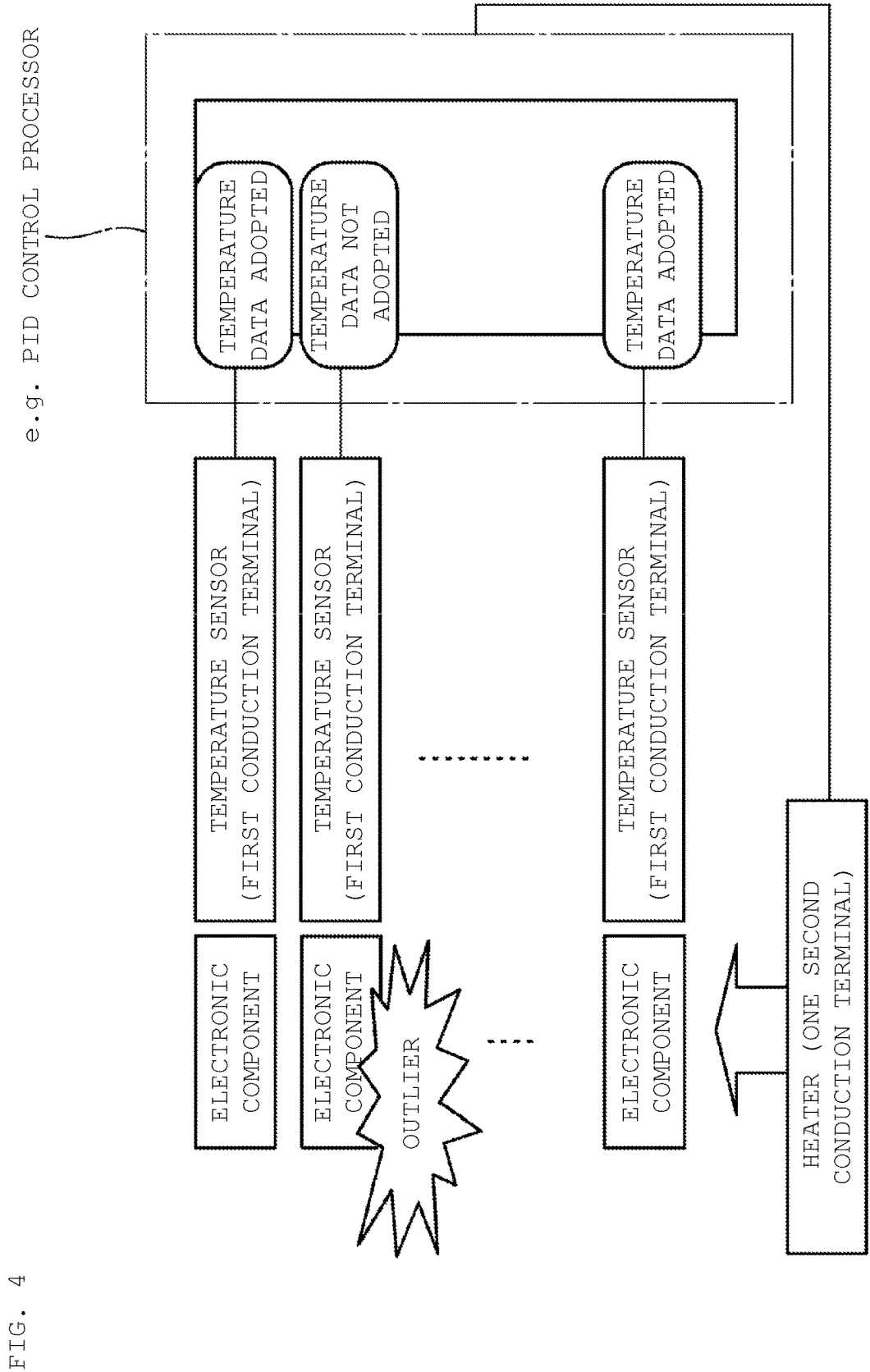
FIG. 4 is a diagram schematically illustrating the configuration of an electronic component testing device according to yet another embodiment (Embodiment 4) of the present disclosure.

FIG. 4 is a diagram schematically illustrating the configuration of an electronic component testing device according to yet another embodiment (Example 4) of the present disclosure.

The electronic component testing device A according to Embodiment 4 is, as shown in FIG. 4, configured to have a plurality of temperature sensors provided for respective electronic components (for example, multilayer ceramic capacitors), and heat the plurality of electronic components to a predetermined test temperature with one heater (more particularly, one second conduction terminal including a heater), and configured to allow the temperature of each of the plurality of electronic components to be detected by the temperature sensor.

Further, the device is configured to, for the detected temperatures, perform a calculation for averaging or extracting a representative value, and feed the average value or extracted representative value back to the heater to control the heater so that the temperatures of the electronic components are kept at a predetermined temperature, and also exclude, when any of the plurality of temperature sensors detects an abnormal temperature, the electronic component from which the abnormal temperature is detected, from the objects of calculation.

More specifically, in Embodiment 4 herein, the plurality of electronic component are subjected to temperature control with one heat source (that is, one second conduction terminal), and from the results of measuring the temperatures of the electronic components with the temperature sensors, a control signal is transmitted (fed back) to the heater (the heater provided to one first conduction terminal) through a temperature regulation unit for performing any temperature controlling calculation as typified by, for example, a PID control.

Further, for the control through the feedback of the control signal, for example, (a) a short-circuited electronic component, (b) an abnormally radiating electronic component, and (c) an electronic component with a detected temperature presumed to be obviously abnormal due to contact failure between the electronic component and the temperature sensor are excluded from the objects of feedback, and the temperatures detected by the temperature sensors for the remaining electronic components are used in the calculation for averaging or extracting a representative value.

The configuration as in Embodiment 4 makes it possible to, for example, when an abnormal temperature due to self-heating is detected in each electronic component, detect the temperature as an outlier, thereby making it possible to almost eliminate the influence on the other majority of electronic components, and succeeding in achieving proper temperature control.

It is to be noted that as a method for detecting abnormalities, it is also possible to, for example, in the case of measuring an electrical property such as an electric current or a resistance, detect the abnormalities based on abnormalities in such electrical property, rather than the detection of abnormalities in temperature.

It is to be noted that while a case of being configured to have a plurality of temperature sensors provided to respective electronic components (for example, multilayer ceramic capacitors), and heat the plurality of electronic components to a predetermined test temperature with one heater (more particularly, one second conduction terminal including a heater) has been described in Embodiment 4, it is also possible to be configured to divide a plurality of electronic components into a plurality of predetermined groups, and detect the temperatures of the plurality of electronic components in the groups with one temperature sensor, as is the case in Embodiments 2 and 3, for example.

It is to be noted that while cases in which the electronic components are multilayer ceramic capacitors have been explained as examples in the respective embodiments described above, it is possible to apply the present disclosure in the case of carrying out tests on not only multilayer ceramic capacitors, but also other electronic components such as semiconductor devices, e.g., negative temperature coefficient thermistors, diodes, and transistors, and some capacitors other than ceramic capacitors.

In addition, while cases in which the temperature sensors are thermocouples have been explained as examples in the embodiments, it is also possible to use, as the temperature sensor, for example, resistance temperature detectors or the like that make use of the phenomenon that the electrical resistance of a metal varies in approximate proportion to temperature.

The present disclosure is not to be considered limited to the embodiments described above even further in other respects, and various applications and modifications can be made within the scope of the disclosure in regard to the configurations of the first conduction terminal and second conduction terminal, the configuration of the control unit for controlling the heater, etc.

The invention claimed is:

1. An electronic component testing device for carrying out a test by applying a voltage while keeping a self-heating electronic component that includes a first external electrode and a second external electrode at a predetermined test temperature higher than ordinary temperature, the device comprising:
    a first conduction terminal that is brought into abutment with the first external electrode included in the electronic component;
    a temperature sensor provided to the first conduction terminal, for measuring a temperature of the electronic component;
    a second conduction terminal that is brought into abutment with the second external electrode included in the electronic component, the second conduction terminal including a heater for heating the electronic component to the test temperature, and having an ability to release a larger amount of heat than the amount of heat generated by self-heating of the electronic component; and
    a control unit for feeding back a temperature of the electronic component detected by the temperature sensor to the heater, and controlling the heater so that the temperature of the electronic component is kept at the predetermined test temperature.

2. The electronic component testing device according to claim 1, further comprising:
    an auxiliary heater provided near the first conduction terminal to keep heat from escaping from the electronic component through the first conduction terminal.

3. The electronic component testing device according to claim 1,
    wherein the first conduction terminal includes a plurality of first conduction terminals,
    the individual first conduction terminals are brought into abutment with respective first external electrodes of a plurality of self-heating electronic components arranged in order,
    the temperature sensor is provided to at least one of the first conduction terminals in individual abutment with the plurality of electronic components, and
    the second conduction terminal is brought into abutment with second external electrodes of the plurality of electronic components.

4. The electronic component testing device according to claim 3,
    wherein the individual first conduction terminals are brought into abutment with the respective first external electrodes of the plurality of electronic components and the second conduction terminal is brought into abutment with the second external electrodes to heat the plurality of electronic components to a predetermined test temperature,
    the temperature sensor includes a plurality of temperature sensors that detect respective temperatures of the plurality of electronic components, or temperatures of predetermined electronic component groups into which the plurality of electronic components are divided, and the device is configured to perform a calculation for averaging or extracting a representative value from the temperatures detected by the plurality of temperature sensors, to feed the average value or the representative value back to the heater to control the heater so that the temperatures of the electronic components or electronic component groups are kept at the predetermined test temperature, and when a temperature detected by any of the temperature sensors is abnormal, to exclude an electronic component or an electronic component group from which the abnormal temperature is detected from objects of calculation.

5. The electronic component testing device according to claim 1, the device further comprising:
a cooling unit that cools the second conduction terminal with airflow.

* * * * *